US011495518B2

(12) United States Patent
Kothari et al.

(10) Patent No.: US 11,495,518 B2
(45) Date of Patent: Nov. 8, 2022

(54) MULTI-SURFACE HEAT SINK SUITABLE FOR MULTI-CHIP PACKAGES

(71) Applicant: Intel Corporation, Santa Ana, CA (US)

(72) Inventors: Shrenik Kothari, Chandler, AZ (US); Sandeep Ahuja, Portland, OR (US); Susan Smith, Olympia, WA (US); Jeffory Smalley, East Olympia, WA (US); Francisco Gabriel Lozano Sanchez, Tlajomulco de Zuniga (MX); Maria de la Luz Belmont Velazquez, Zapopan (MX); Je-Young Chang, Phoenix, AZ (US); Jorge Contreras Perez, Guadalajara (MX); Phil Geng, Portland, OR (US); Andres Ramirez Macias, Zapopan (MX); Gilberto Rayas Paredes, Zapopan (MX)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 16/264,419

(22) Filed: Jan. 31, 2019

(65) Prior Publication Data
US 2020/0251403 A1    Aug. 6, 2020

(51) Int. Cl.
*H01L 31/00*       (2006.01)
*H01L 21/00*       (2006.01)
*H01L 23/40*       (2006.01)
*H01L 25/18*       (2006.01)
*H01L 23/427*      (2006.01)

(52) U.S. Cl.
CPC ............ *H01L 23/40* (2013.01); *H01L 23/427* (2013.01); *H01L 25/18* (2013.01)

(58) Field of Classification Search
CPC .............................. H01L 23/40; H01L 23/427; H01L 2023/4068
USPC ......... 438/117–123; 257/675, 706, 717–722, 257/796
See application file for complete search history.

(56) References Cited

U.S. PATENT DOCUMENTS

| | | | | |
|---|---|---|---|---|
| 8,109,321 | B2 * | 2/2012 | Alousi | H01L 23/367 165/104.21 |
| 8,437,138 | B2 * | 5/2013 | Wertz | H01L 23/4338 361/720 |
| 9,379,039 | B2 * | 6/2016 | Lam | H01L 23/473 |
| 9,806,003 | B2 * | 10/2017 | Smalley | H05K 7/20509 |

(Continued)

*Primary Examiner* — Calvin Lee
(74) *Attorney, Agent, or Firm* — Essential Patents Group, LLP.

(57) ABSTRACT

An apparatus incorporating a multi-surface heat sink may comprise an integrated circuit die, a heat spreader, a plate element, and a heat sink. The heat spreader may be positioned above the IC die. The plate element may be positioned above the heat spreader. A bottom surface of the heat sink may have a first region positioned above the plate element. One or more spring elements may be positioned between the plate element and the first region of the bottom surface of the heat sink. The one or more spring elements may be under a compressive load between the plate element and the heat sink. One or more thermal conduit elements may be secured to both the plate element and the heat sink. The one or more thermal conduit elements may apply at least a part of the compressive load between the plate element and the heat sink.

16 Claims, 8 Drawing Sheets

(56) References Cited

U.S. PATENT DOCUMENTS 10,212,859 B2 * 2/2019 Yu ........................ F28D 15/0275
10,721,838 B1 * 7/2020 Bhatia ................ H05K 7/20809

* cited by examiner

MULTI-SURFACE HEAT SINK SUITABLE FOR MULTI-CHIP PACKAGES

BACKGROUND

Components of electronic systems often generate significant thermal energy, which may then be dissipated. A component (such as an integrated circuit die) may be packaged with a heat spreader (for example, an integrated heat spreader), and a layer of Thermal Interface Material (TIM) may be placed between the component and the integrated heat spreader. The packaged component may then be oriented adjacent to, and flush with, a heat sink. Another layer of Thermal Interface Material may be placed between the packaged component and the heat sink.

In some systems, multiple packaged components may be thermally coupled to the same heat sink.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
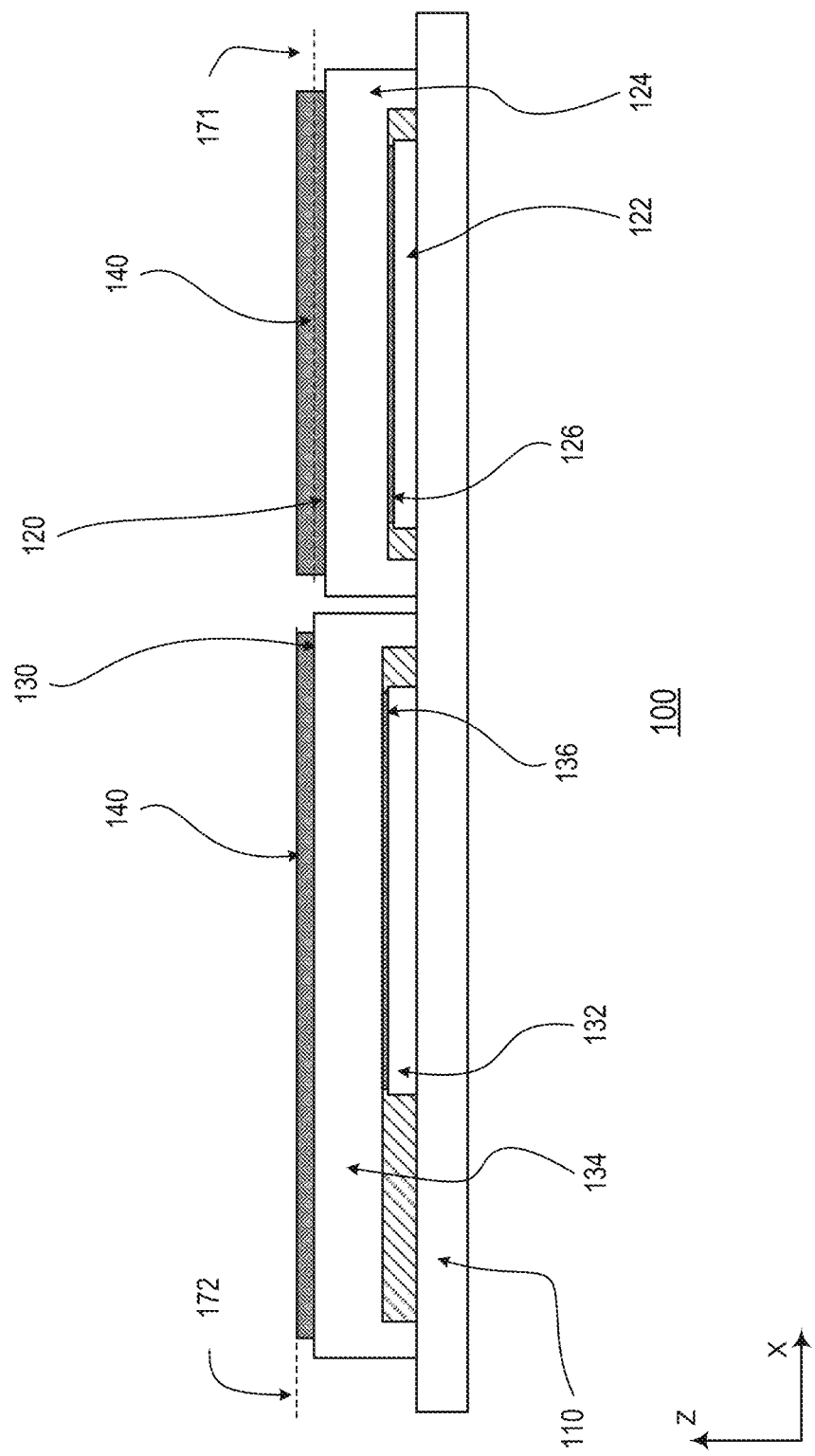
FIG. 1 is a cross-sectional side view of a heat sink and two packaged components.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Terms such as "upper" and "lower" "above" and "below" may be understood by reference to illustrated X-Z coordinates, and terms such as "adjacent" may be understood by reference to X,Y coordinates or to non-Z coordinates. Therefore, the following detailed description is not to be taken in a limiting sense and the scope of claimed subject matter is defined solely by the appended claims and their equivalents.

In the following description, numerous details are set forth. However, it will be apparent to one skilled in the art that the present embodiments may be practiced without these specific details. In some instances, well-known methods and devices are shown in block diagram form, rather than in detail, to avoid obscuring the inventive aspects of the exemplary embodiments. Reference throughout this specification to "an embodiment" or "one embodiment" means that a particular feature, structure, function, or characteristic described in connection with the embodiment is included in at least one embodiment. Thus, appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicate that two or more elements are in either direct or indirect (with other intervening elements between them) physical, optical, electrical, or electromagnetic contact with each other, and/or that the two or more elements co-operate or interact with each other (e.g., as in a cause-and-effect relationship).

The terms "over," "under," "between," and "on" as used herein refer to a relative position of one component or material layer with respect to other components or material layers where such physical relationships are noteworthy. For example, in the context of components, one component positioned or disposed over or under another component may be directly in contact with the other component, or may have one or more intervening component. Moreover, one component disposed between two component may be directly in contact with the two component, or may have one or more intervening components. In contrast, a first component "on" a second component is in direct contact with that second component. Similar distinctions are to be made in the context of layered assemblies.

Exemplary embodiments of multi-surface heat sinks are described in detail herein. A multi-surface heat sink may be superior to a heat sink having a single base surface, particularly for a multi-Chip Package (MCP), where different integrated circuit (IC) dies of the package have different nominal heights and/or tolerances. With a multi-surface heat sink, MCP assemblies may have a separate integrated heat spreader (IHS) for each component, and/or may have a thermal-dissipation pathway for a first IC die (e.g., IC die within the MCP having a highest power density) that is less determinative of the thermal dissipation pathway for another IC die (e.g., IC die within the MCP having a lower power density). Some multi-surface heat sink embodiments may incorporate plate elements (e.g., flexible plates) at a companion-IC-die region of a heat sink to accommodate a different (e.g., larger) gap between the heat sink and the IHS of a companion IC die. Accordingly, TIM between a heat sink and more than one IHS might be optimized to have a lowest thermal resistance. For example, a smaller bond line thickness (BLT) may be maintained within both a first IC die region and a second IC die region regardless of differences in the nominal heights of the IC dies. A multi-surface heat sink with multiple, split surfaces may accommodate optimization of a first level of TIM (e.g., a TIM1) on the plurality of packages, and/or optimization of a second level of TIM (e.g., a TIM2) within the plurality of packages.

A multi-surface heat sink may also advantageously accommodate application of a specific load on multiple die of the MCP. For example, a load placed upon a companion IC die may depend less directly upon the package heat sink loading mechanism (PHLM), and multi-surface heat sinks may therefore permit a wider application of different MCPs (e.g., applications with a bare companion IC die).

FIG. 1 is a cross-sectional side view of a heat sink and two packaged components. An apparatus 100 may comprise a base element 110, a packaged component 120, a packaged component 130, and a TIM layer 140.

Base element 110 may be a printed circuit board (PCB) or another substrate for placing and/or mounting packaged components. Packaged component 120 includes an IC die 122, a IHS 124, and a TIM layer 126. IC die 122 may include a microelectronic circuitry. In various embodiments, IC die 122 may contain devices photolithographed or otherwise manufactured on a substrate, such as a semiconductor substrate. IHS 124 may include a highly thermally-conductive material, such as a metal. TIM layer 126 may include, for example, a thermal adhesive, a thermal tape, a thermally conductive pad, a thermal grease, a phase-change material, or another material to enhance thermal coupling between IC die 122 and IHS 124.

Packaged component 130 includes an IC die 132, an IHS 134, and a TIM layer 136. IC die 132 may include microelectronic circuitry. In various embodiments, IC die 132 may contain devices photolithographed or otherwise manufactured on a substrate, such as a semiconductor substrate. IHS 134 may include a highly thermally-conductive material, such as a metal. TIM layer 136 may include, for example, a thermal adhesive, a thermal tape, a thermally conductive pad, a thermal grease, a phase-change material, or another material to enhance thermal coupling between IC die 132 and IHS 134.

In some embodiments, packaged component 130 may include a Central Processing Unit (CPU) IC die, and packaged component 120 may include an IC die that is a companion IC die to the CPU IC die (for example, a Graphics Processing Unit (GPU), a memory IC, or another IC die that the CPU IC die interoperates with).

TIM layer 140 may have the same composition as TIM layer 126 and/or TIM layer 136. TIM layer 140 may enhance a thermal coupling between packaged component 120 and a heat sink, and may also enhance thermal coupling between packaged component 130 and the heat sink.

In apparatus 100, a heat sink may have a substantially non-planar bottom surface as represented by dashed lines 171 and 172. The heat sink may have a fixed spatial relationship with respect to base element 110. Absent the non-planar bottom surface, for example where a heat sink has only a single surface following dashed line 171, a thickness of TIM layer 140 between packaged component 120 and the heat sink may be directly related to that fixed spatial relationship and a height (z-dimension) of packaged component 120, while a thickness of TIM layer 140 between packaged component 130 and the heat sink may be directly related to that fixed spatial relationship and a height of packaged component 130. Accordingly, the thickness of TIM layer 140 above packaged component 120 may be tied to the thickness of TIM layer 140 above packaged component 130.

As such, TIM layer 140 may be configured for thermal dissipation associated with only one of IC dies 122 and 132. A multi-surface heat sink that can follow both dashed lines 171 and 172 can decouple the thicknesses of TIM layer 140 above packaged components 120 and 130 from thermal dissipation associated with the companion IC die.

Thus, the thermal dissipation characteristics of TIM layer 140 (as well as of TIM layer 126 and/or TIM layer 136) may be optimized for thermal dissipation of multiple IC die (e.g., a CPU IC die and a companion die). Such an architecture might also reduce z-dimension separation between components, and improve the ability of a Multi-Chip Package (MCP) to accommodate components of greater z-height variation.

In some embodiments, mechanical systems may provide package IHS height compensation for multiple MCPs and accommodate multiple integrated heat spreaders by incorporating a plate element (e.g., a flexible base) that allows height compensation. A plate element may also support independent load requirements, which may facilitate a heat sink to satisfy multiple mechanical integrity criteria associated with different IC die of a MCP. For example, a plate element (e.g., a flexible plate) that accommodates an independent load on a companion IC die region, various heat sink embodiments may satisfy structural integrity criteria for companion IC dies as well as for a CPU die.

A plate element (e.g., a flexible base) may allow for a reduction in a TIM2 bond line thickness (BLT) for one or more components in an MCP with a split IHS (up to and including each component), which may facilitate maximum optimization of thermal interface materials, since TIM1 and TIM2 components may be optimized (e.g., by varying their thicknesses) independently. This may in turn advantageously translate into lower thermal resistances for some or all components present in an MPC, and may reduce overall temperatures for all operating IC dies. Accordingly, various embodiments may provide mechanisms and methods for reducing maximum temperatures for IC dies within MCPs by optimizing both levels of interface materials (e.g., TIM) at various IC dies.

Figure 2A:
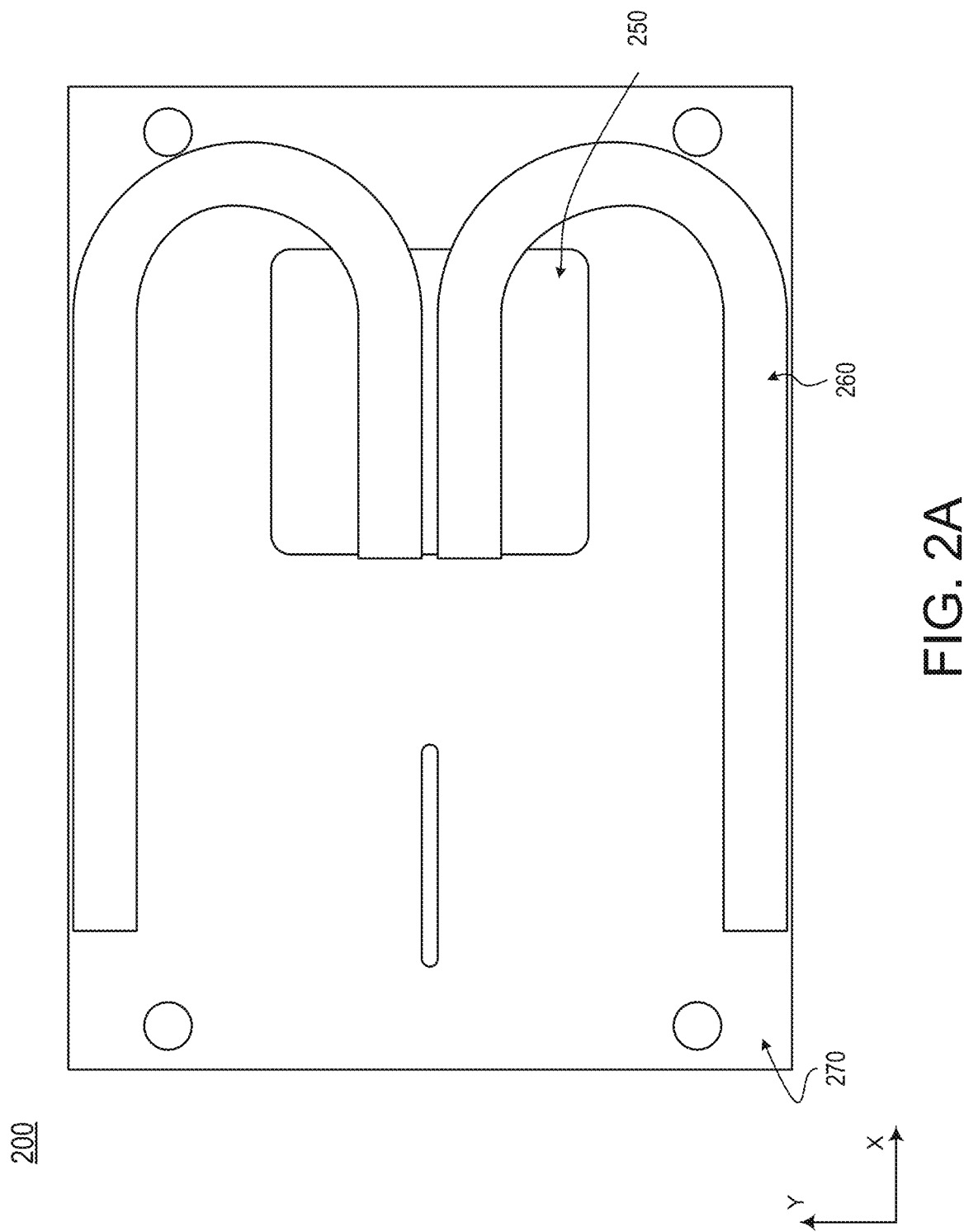
FIG. 2A is a bottom view of a multi-surface heat sink, in accordance with some embodiments.
Figure 2B:
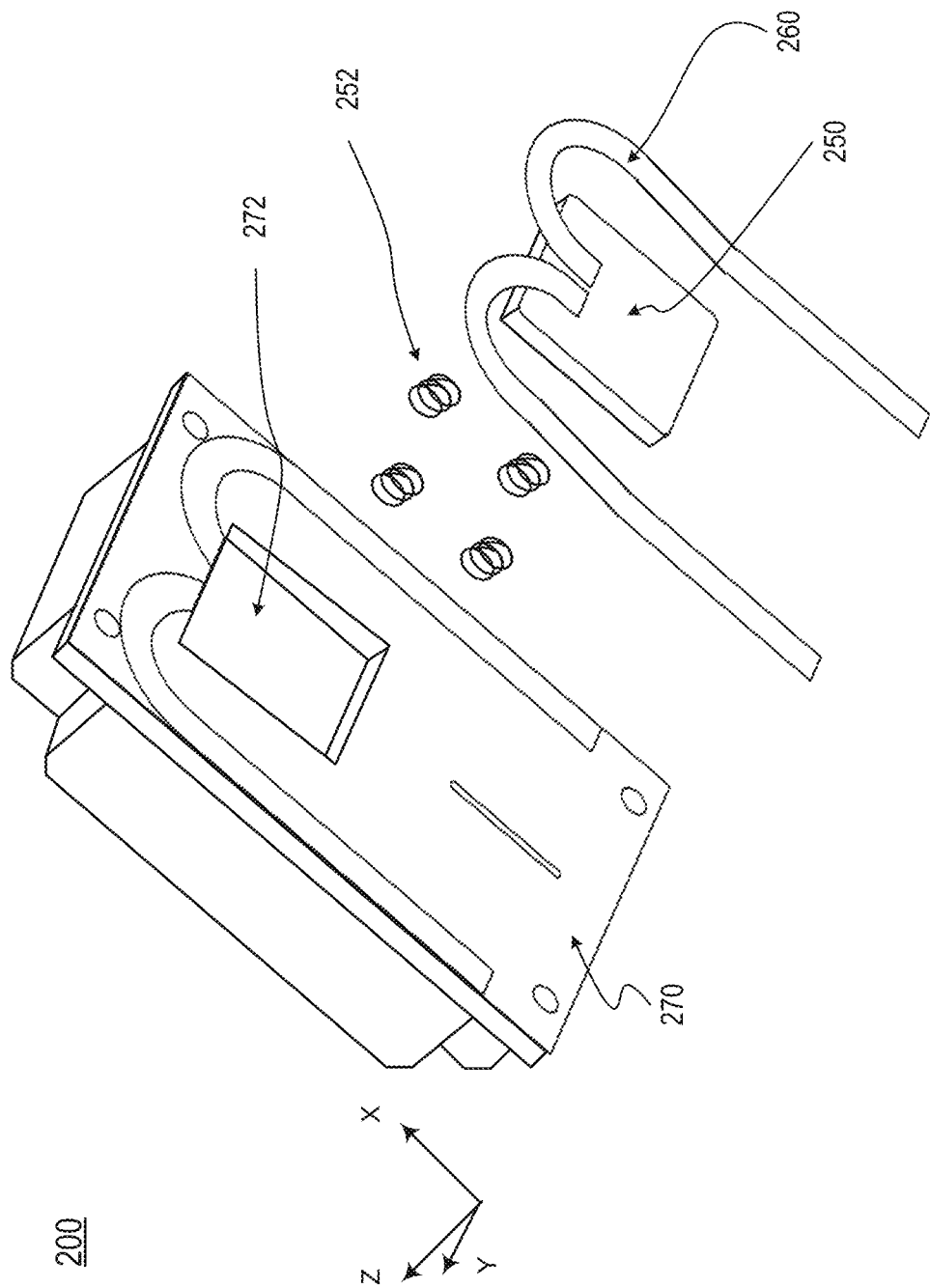
FIG. 2B is an exploded perspective bottom view of a multi-surface heat sink, in accordance with some embodiments.

FIG. 2A is a bottom view of a multi-surface heat sink apparatus 200, in accordance with some embodiments. FIG. 2B is an exploded perspective bottom view of multi-surface heat sink apparatus 200, in accordance with some embodiments. Apparatus 200 may comprise a plate element 250, one or more thermal conduit elements 260, and a heat sink 270 (which may be a heat sink base).

A bottom surface of heat sink 270 includes an indentation 272, and plate element 250 may be at least partially located within indentation 272. One or more spring elements 252 are located between indentation 272 and plate element 250. For some embodiments, spring elements 252 may comprise one or more coil-type springs or leaf-type springs. Spring elements 252 may provide a static load when the PHLM is activated, which in turn may facilitate or ensure sufficient contact on an associated IHS surface. Spring elements 252 may be located between heat sink 270 and plate element 250 (e.g., within indentation 272), and a gap may remain therebetween. The gap may be substantially uniform or constant across the indentation. A heat transfer resistance of plate element 250 may thereby be mitigated by securing thermal conduit elements 260 to both heat sink 270 and plate element 250.

Thermal conduit elements 260 may transfer heat through plate element 250 and to heat sink 270, which may have fin structures to maximize a thermal dissipation capacity of the heat-sink, enhancing thermal dissipation performance for multiple IC dies. Thermal conduit elements 260 may be at least partially embedded within heat sink 270. In some embodiments, thermal conduit elements 260 comprise heat pipes.

Figure 3:
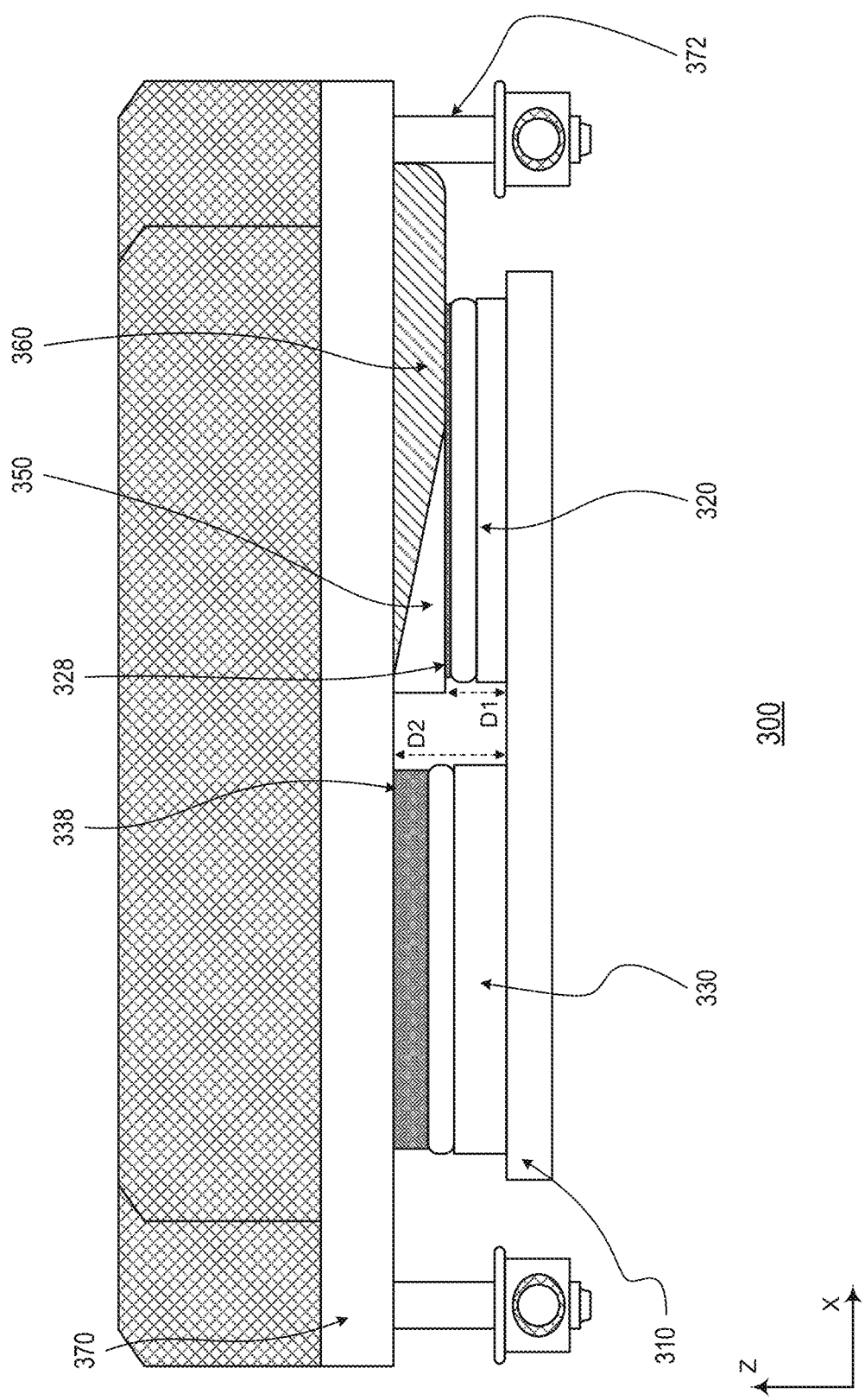
FIG. 3 is a side view of an apparatus comprising a multi-surface heat sink and two packaged components, in accordance with some embodiments.

FIG. 3 is a side view of an apparatus 300 comprising a multi-surface heat sink and two packaged components 320 and 330, in accordance with some embodiments. Apparatus 300 includes a plate element 350, one or more thermal conduit elements 360, and a heat sink 370 (each which may be similar to plate element 250, thermal conduit elements 260, and/or heat sink 270, respectively).

Apparatus 300 includes a base element 310, a packaged component 320, and a packaged component 330. Base element 310 (which may be similar to base element 110) may be a PCB or another substrate for placing and/or mounting packaged components. In some embodiments, a top surface of heat sink 370 may comprise a plurality of fin structures. In some embodiments, a bottom surface of 370 may comprise one more protruding elements 372, which may be employed to secure heat sink 370 to base element 310.

Packaged component 320 may comprise one or more first IC dies (any of which may be similar to IC die 122), a first IHS (which may be similar to IHS 124), and a TIM layer therebetween (e.g., a TIM2 layer, which may be similar to TIM layer 126). Packaged component 330 may comprise one or more second IC dies (any of which may be similar to IC die 132), a second IHS (which may be similar to IHS 134), and a TIM layer therebetween (e.g., a TIM2 layer, which may be similar to TIM layer 136).

A bottom surface of heat sink 370 may comprise an indentation, and plate element 350 may be at least partially located within the indentation. Apparatus 300 may also comprise one or more spring elements located between the indentation and plate element 350. In some embodiments, the one or more spring elements may comprise a leaf spring.

Apparatus 300 additionally includes a TIM layer 328 and a TIM layer 338 (either or both of which may be similar to TIM layer 140, and may be, e.g., TIM1 layers). TIM layer 328 may enhance a thermal coupling between packaged component 320 and plate element 350, while TIM layer 338 may enhance a thermal coupling between packaged component 330 and heat sink 370.

For some embodiments, the one or more protruding elements may hold a first surface on a bottom surface of the plate element at a first distance D1 from a top surface of the base element, and may hold a second surface in the second region of the heat sink at a second distance D2 from the top surface of the base element. In some embodiments, a first sum of a height of the first TIM and a height of the second TIM may be less than a second sum of a height of the third TIM and a height of the fourth TIM.

Figure 4:
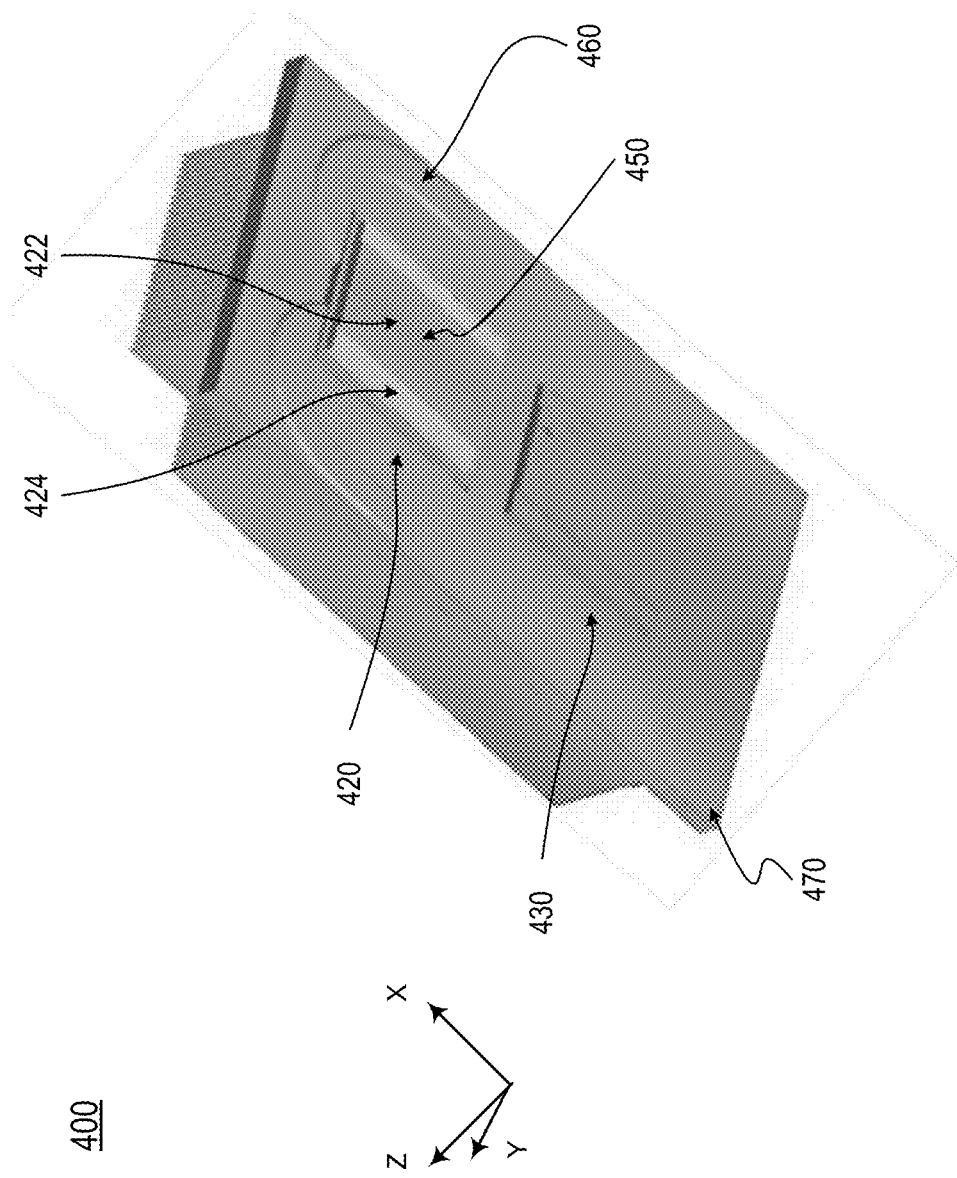
FIG. 4 is a Computational Fluid Dynamics simulation result for a multi-surface heat sink, in accordance with some embodiments.

FIG. 4 is a Computational Fluid Dynamics (CFD) simulation result for a multi-surface heat sink, in accordance with some embodiments. An apparatus 400 may comprise a plate element 450, one or more thermal conduit elements 460, and a heat sink 470 (which may be similar to, respectively, plate element 250, thermal conduit elements 260, and heat sink 270).

The simulation results may depict thermal performance of apparatus 400 under model conditions. Simulation results for apparatus 400 may pertain to a first region 420 and a second region 430, of which first region 420 may have a central area 422 between peripheral areas 424. First region 420 may correspond with plate element 250. Per the simulation results, a thermal performance of apparatus 400 in first region 420 may differ from a thermal performance of apparatus 400 in second region 430. In some embodiments (e.g., embodiments incorporating a leaf-type spring element), a thermal performance of apparatus 400 in central area 422 may differ from a thermal performance of apparatus 400 in peripheral areas 424.

Thermal performance of apparatus 400 may be evaluated using a more detailed thermal test vehicle (TTV) that may include geometric conditions, tolerances, dimensions, and configurations of typical MCPs to identify potential opportunities for thermal improvement of a multi-surface heat sink. Once the model has been correlated, a TTV model similar to that used for different product evaluations may implemented. For purposes of this analysis, an IHS may be sectioned and a companion IC die section may be monitored to evaluate different variations of TIM1 BLT and TIM2 BLT.

Simulation results have indicated that a companion-IC-die junction temperature is 3.5° C. lower than that of a baseline solution which is the configuration with optimum TIM1 thickness. A case temperature also decreases, since TIM2 thickness is also reduced due to the presence of a multi-surface heat sink. Under a 35 watt companion IC die scenario, we see 3.5° C. lower temperatures at case and junction when implementing both solutions, versus a scenario with only a multi IHS configuration which targets TIM1 thickness optimization.

It is important to notice that these results are obtained when applying 35 W at a companion IC die. If power loss increases at that IC die, it may be expected to have larger temperature differences, and therefore higher impacts on temperatures when applying these solutions to MCP configurations.

Figure 5:
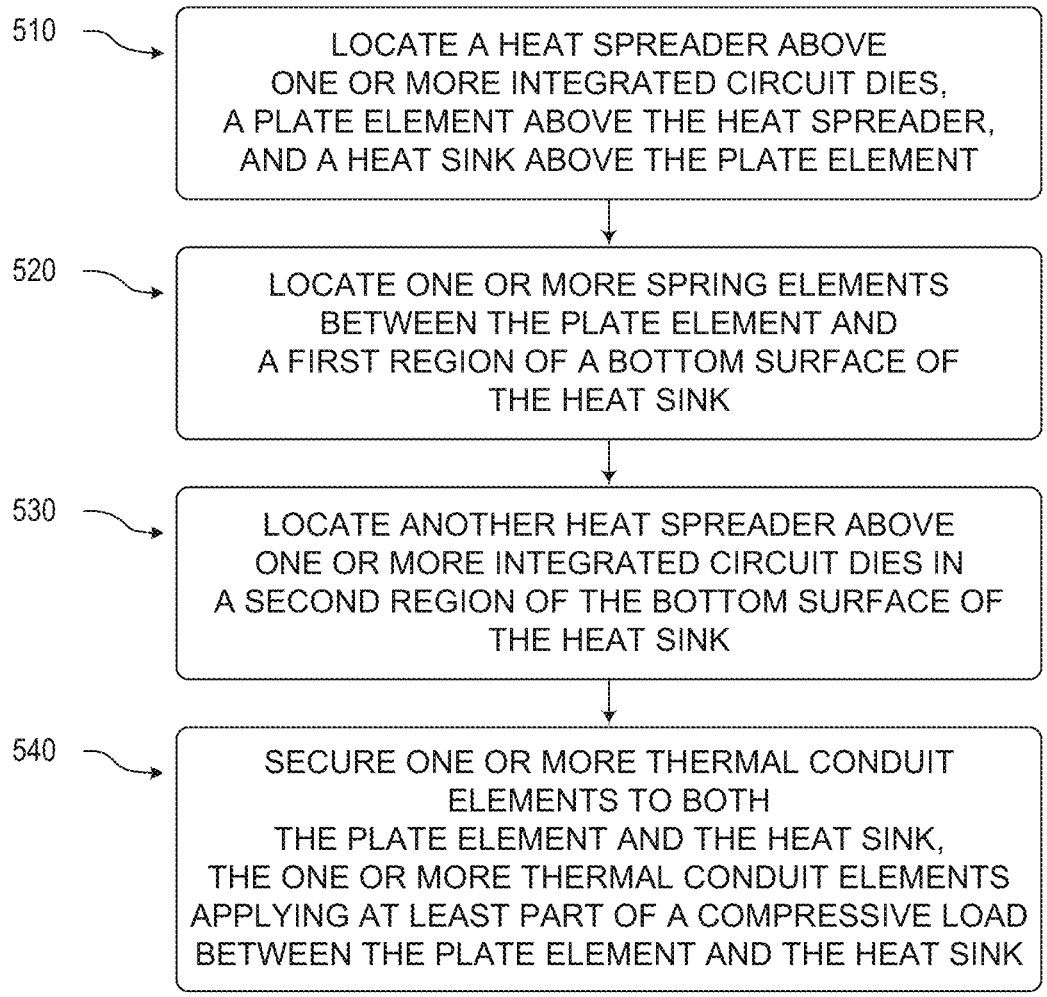
FIG. 5 is a flow diagram illustrating methods of incorporating a multi-surface heat sink into an apparatus for improved thermal dissipation, in accordance with some embodiments.

FIG. 5 is a flow diagram illustrating methods of incorporating a multi-surface heat sink into an apparatus for improved thermal dissipation, in accordance with some embodiments.

At block 510, a heat spreader (such as a first IHS of packaged component 320) may be located above one or more IC dies (such as the first IC dies of packaged component 320). A plate element (such as plate element 250 or plate element 350) may be located above the heat spreader, and a heat sink (such as heat sink 270 or heat sink 370) may be located above the plate element.

At block 520, one or more spring elements (such spring elements 252) may be located between the plate element and a first region of a bottom surface of the heat sink.

At block 530, another heat spreader may be located above one or more IC dies (such as the second IC dies of packaged component 330) in a second region of the bottom surface of the heat sink.

At block 540, one or more thermal conduit elements (such as thermal conduit elements 260 or thermal conduit elements 360) may be secured to both the plate element and the heat sink element. The one or more thermal conduit elements may then apply at least part of a compressive load between the plate element and the heat sink.

Figure 6:
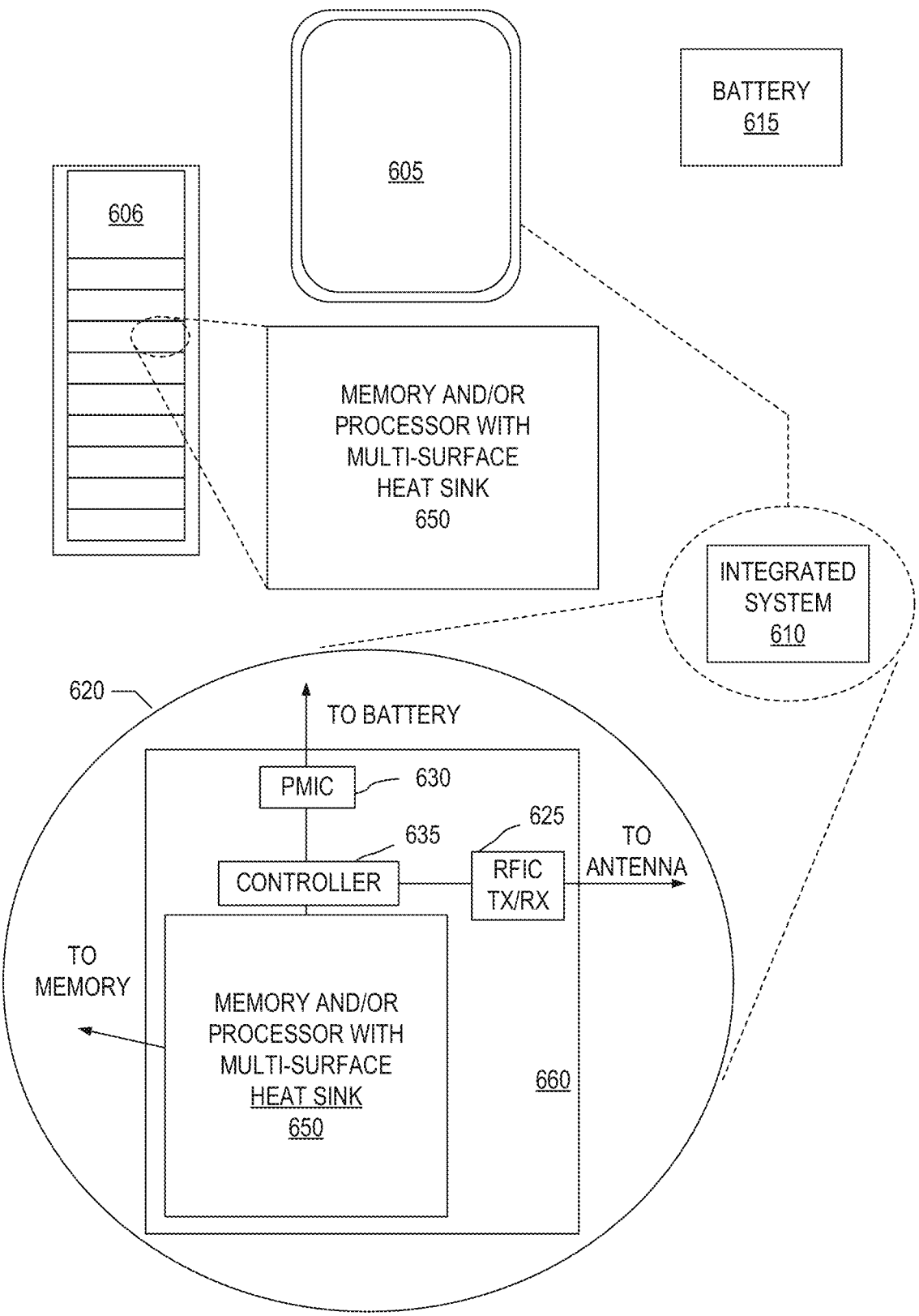
FIG. 6 illustrates a mobile computing platform and a data server machine employing a package including a multi-surface heat sink, in accordance with some embodiments.

FIG. 6 illustrates a mobile computing platform and a data server machine employing a package including a multi-surface heat sink, for example as described elsewhere herein. The server machine 606 may be any commercial server, for example including any number of high-performance computing platforms disposed within a rack and networked together for electronic data processing, which in the exemplary embodiment includes a packaged monolithic SoC 650. The mobile computing platform 605 may be any portable device configured for electronic data display, for electronic data processing, for wireless electronic data transmission, or the like. For example, the mobile computing platform 605 may be any of a tablet, a smart phone, a laptop computer, etc., and may include a display screen (e.g., a capacitive, inductive, resistive, or optical touchscreen), a chip-level or package-level integrated system 610, and a battery 615.

Either disposed within the integrated system 610 illustrated in the expanded view 620, or as a stand-alone packaged chip within the server machine 606, monolithic SoC 650 includes a memory block (e.g., RAM) and a processor block (e.g., a microprocessor, a multi-core microprocessor, graphics processor, or the like). The packaged chip includes a multi-surface heat sink, for example as described elsewhere herein. The monolithic SoC 650 may be further coupled to a board, a substrate, or an interposer 660 along with one or more of a power management integrated circuit (PMIC) 630, an RF (wireless) integrated circuit (RFIC) 625 including a wideband RF (wireless) transmitter and/or receiver (TX/RX) (e.g., including a digital baseband and an analog front end module further comprises a power amplifier on a transmit path and a low noise amplifier on a receive path), and a controller 635.

Functionally, PMIC 630 may perform battery power regulation, DC-to-DC conversion, etc., and so has an input coupled to battery 615 and with an output providing a current supply to other functional modules. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 650.

Figure 7:
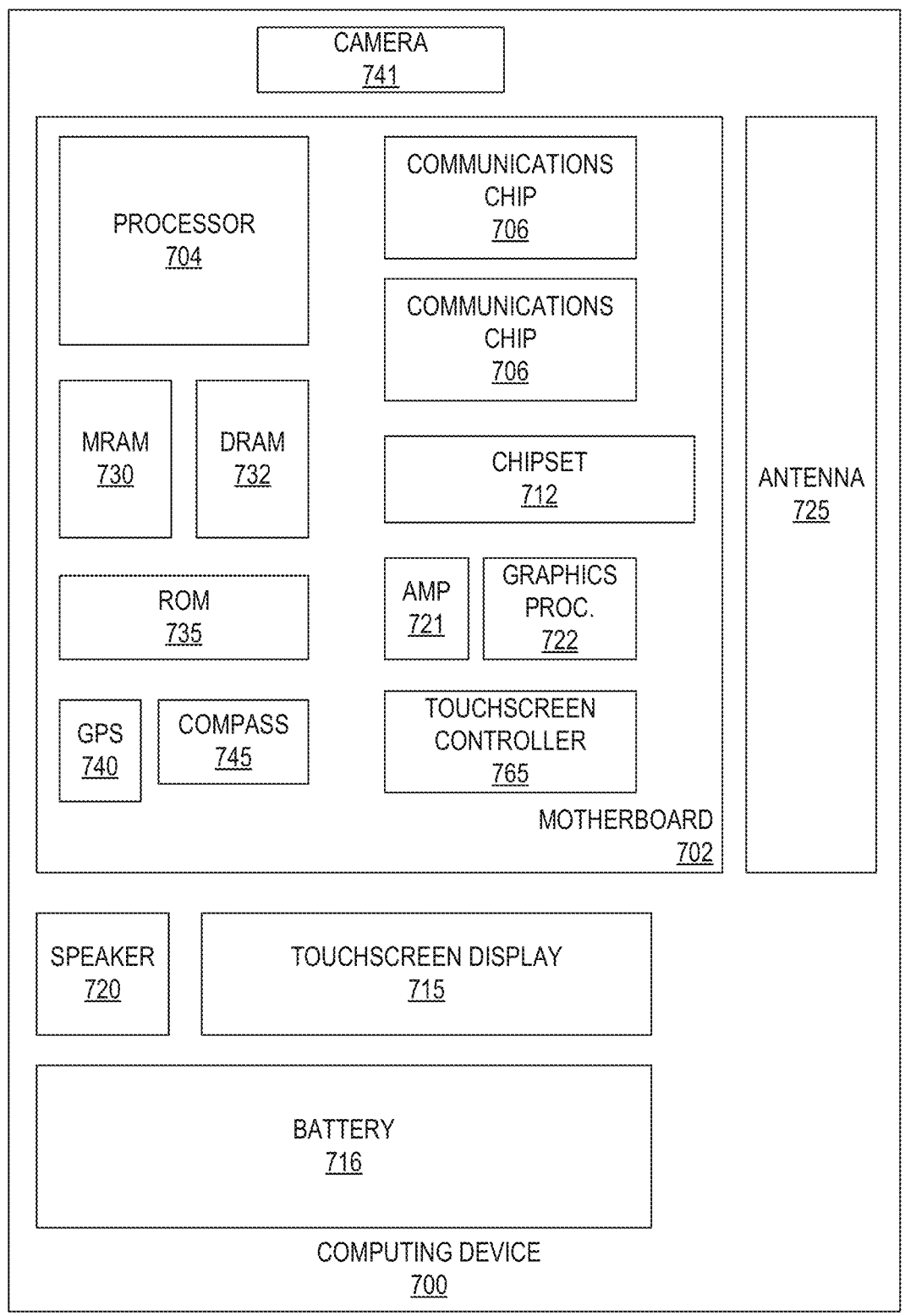
FIG. 7 is a functional block diagram of an electronic computing device, in accordance with some embodiments.

FIG. 7 is a functional block diagram of an electronic computing device, in accordance with some embodiments. Computing device 700 may be found inside platform 605 or server machine 606, for example. Device 700 further includes a motherboard 702 hosting a number of components, such as, but not limited to, a processor 704 (e.g., an applications processor). Processor 704 may be physically and/or electrically coupled to motherboard 702. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM 732), non-volatile memory (e.g., ROM 735), flash memory (e.g., NAND or NOR), magnetic memory (e.g., MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth), or the like. In some exemplary embodiments, a multi-surface heat sink (for example, as described elsewhere herein) may be coupled to least one of the functional blocks noted above, such as processor 704 or graphics processor 722.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including but not limited to those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the principles of the disclosure are not limited to the exemplary embodiments so described, but can be practiced with modification and alteration without departing from the scope of the appended claims. For example, the above embodiments may include specific combination of features.

An embodiment 1 provides apparatus comprising: an integrated circuit (IC) die; a heat spreader positioned above the IC die; a plate element positioned above the heat spreader; a heat sink with a bottom surface having a first region and a second region spaced from the first region, the first region being positioned above the plate element; one or more spring elements positioned between the plate element and the first region of the bottom surface of the heat sink, the one or more spring elements being under a compressive load between the plate element and the heat sink; and one or more thermal conduit elements secured to both the plate element and the heat sink.

An embodiment 2 provides the apparatus of embodiment 1, wherein the one or more thermal conduit elements apply at least a part of the compressive load between the plate element and the heat sink.

An embodiment 3 provides the apparatus of any of embodiments 1-2, comprising: a base element; and one or more protruding elements extending outward from the bottom surface of the heat sink to secure the apparatus to a base element, wherein the one or more protruding elements apply at least a part of the compressive load between the plate element and the heat sink.

An embodiment 4 provides the apparatus of any of embodiments 1-3, wherein the one or more protruding elements hold a first surface on a bottom surface of the plate element at a first distance from a top surface of the base element, and hold a second surface in the second region of the heat sink at a second distance from the top surface of the base element.

An embodiment 5 provides the apparatus of any of embodiments 1-4, wherein the IC die is a first IC die and the heat spreader is a first heat spreader, the apparatus comprising: a second IC die; and a second heat spreader positioned above the second IC die; wherein the second region of the heat sink is positioned above the second heat spreader.

An embodiment 6 provides the apparatus of embodiment 5, comprising: a first Thermal Interface Material (TIM) between the first heat spreader and a bottom surface of the plate element; a second TIM between the first heat spreader and the first IC die; a third TIM between the second heat spreader and a surface in the second region of the heat sink; and a fourth TIM between the second heat spreader and the second IC die, wherein a first sum of a height of the first TIM and a height of the second TIM is less than a second sum of a height of the third TIM and a height of the fourth TIM.

An embodiment 7 provides the apparatus of any of embodiments 1-6, wherein the heat sink has an indentation in the second region; and wherein at least a portion of the plate element is located within the indentation.

An embodiment 8 provides the apparatus of any of embodiments 1-7, wherein the one or more spring elements comprise a leaf spring An embodiment 9 provides the apparatus of any of embodiments 1-8, wherein the one or more thermal conduit elements comprise one or more heat pipes.

An embodiment 10 provides an apparatus comprising: a heat sink having a first side and an opposite second side, the first side having a first region and a second region separated from the first region, the first region having an indentation; a packaged component comprising an integrated circuit (IC) die and a heat spreader positioned adjacent to the IC die; a plate positioned between the first region of the heat sink and the heat spreader, and located at least partially within the indentation; and one or more springs positioned between the plate and the indentation, the one or more springs being under a compressive load between the plate and the heat sink.

An embodiment 11 provides the apparatus of embodiment 10, comprising: a base element; and one or more protruding elements extending outward from the first side of the heat sink to secure the apparatus to the base element, wherein the one or more protruding elements apply at least a part of the compressive load between the plate element and the heat sink.

An embodiment 12 provides the apparatus of any of embodiments 10-11, wherein the one or more protruding elements hold a surface of the plate adjacent to the heat spreader at a first distance from a top surface of the base element, and hold a surface in the second region of the heat sink at a second distance from the top surface of the base element.

An embodiment 13 provides the apparatus of any of embodiments 10-12, wherein the packaged component is a first packaged component, the IC die is a first IC die, and the heat spreader is a first heat spreader, comprising: a second packaged component comprising a second IC die and a second heat spreader positioned adjacent to the second IC die, wherein the second packaged component is positioned adjacent to the second region of the heat sink.

An embodiment 14 provides the apparatus of any of embodiments 10-13, comprising: a first Thermal Interface Material (TIM) between the first heat spreader and a surface of the plate adjacent to the heat spreader; a second TIM between the first heat spreader and the first IC die; a third TIM between the second heat spreader and a surface in the second region of the heat sink; and a fourth TIM between the second heat spreader and the second IC die, wherein a first sum of a height of the first TIM and a height of the second TIM is less than a second sum of a height of the third TIM and a height of the fourth TIM.

An embodiment 15 provides the apparatus of any of embodiments 10-14, wherein the one or more springs comprise a leaf spring.

An embodiment 16 provides the apparatus of any of embodiments 10-15, comprising one or more thermal conduit elements secured to both the plate and the heat sink, wherein the one or more thermal conduit elements apply at least a part of the compressive load between the plate element and the heat sink.

An embodiment 17 provides a system including: a memory; a processor communicatively coupled to the memory a wireless interface coupled to the processor; and an apparatus, comprising: a heat sink with a first side and an opposite second side, the first side having a first region with an indentation and a second region spaced from the first region; a plate positioned proximal to the first region and located at least partially within the indentation; one or more springs positioned between the indentation and the plate, the one or more springs being under a compressive load between the indentation and the plate; a base element; one or more protruding elements extending outward from the first side of the heat sink to secure the apparatus to the base element; a first packaged component comprising a first integrated circuit (IC) die and a first heat spreader; and a second packaged component comprising a second IC die and a second heat spreader, wherein the one or more protruding elements hold the plate against the first heat spreader and hold the second region of the first side of the heat sink against the second heat spreader.

An embodiment 18 provides the system of embodiment 17, further comprising a power supply coupled to the processor.

An embodiment 19 provides the system of any of embodiments 17-18, comprising one or more thermal conduit elements secured to both the heat sink and the plate, wherein the one or more thermal conduit elements apply at least a part of the compressive load on the one or more springs.

An embodiment 20 provides the system of any of embodiments 17-19, wherein the one or more protruding elements apply at least a part of the compressive load between the plate element and the heat sink.

However, the above embodiments are not limited in this regard and, in various implementations, the above embodiments may include undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus comprising:
   a heat sink having a first side and an opposite second side, the first side having a first region and a second region separated from the first region;
   a first integrated circuit (IC) die and a first heat spreader adjacent to the first IC die;
   a plate positioned between the first region of the heat sink and the first heat spreader;
   one or more springs positioned between the plate and the heat sink, the one or more springs to be under a compressive load between the plate and the heat sink;
   a second IC die and a second heat spreader adjacent to the second IC die;
   a first Thermal Interface Material (TIM) between the first heat spreader and the plate;
   a second TIM between the first heat spreader and the first IC die;
   a third TIM between the second heat spreader and a surface in the second region of the heat sink; and
   a fourth TIM between the second heat spreader and the second IC die, wherein a first sum of a height of the first TIM and a height of the second TIM is less than a second sum of a height of the third TIM and a height of the fourth TIM.

2. The apparatus of claim 1, comprising one or more thermal conduit elements secured to both the plate and the heat sink, wherein the one or more thermal conduit elements apply at least a part of the compressive load between the plate element and the heat sink.

3. The apparatus of claim 1, wherein the one or more springs comprise a coil spring or a leaf spring.

4. The apparatus of claim 1, comprising:
   a base element; and
   one or more protruding elements extending outward from the first side of the heat sink to secure the apparatus to the base element,
   wherein the one or more protruding elements apply at least a part of the compressive load between the plate element and the heat sink.

5. The apparatus of claim 4, wherein the one or more protruding elements hold a surface of the plate adjacent to the heat spreader at a first distance from a top surface of the base element, and hold a surface in the second region of the heat sink at a second distance from the top surface of the base element.

6. An apparatus comprising:
   a first integrated circuit (IC) die;
   a first heat spreader above the first IC die;
   a second IC die;
   a second heat spreader above the second IC die;
   a plate element above the first heat spreader, but not above the second heat spreader;
   a heat sink with a bottom surface having a first region and a second region laterally spaced from the first region, the first region above the plate element and the second region, above the second heat spreader;
   one or more spring elements between the plate element and the first region of the bottom surface of the heat sink, the one or more spring elements under a compressive load between the plate element and the heat sink;
   one or more thermal conduit elements secured to both the plate element and the heat sink;
   a thermal interface material (TIM) between the first heat spreader and a bottom surface of the plate element;
   another TIM between the second heat spreader and a bottom surface of the second region of the heat sink;
   a base element; and
   one or more protruding elements extending from the heat sink to hold the bottom surface of the plate element at a first distance from a top surface of the base element, and to hold the bottom surface of the second region of the heat sink at a second distance, greater than the first distance, from the top surface of the base element.

7. The apparatus of claim 6, wherein:
   the TIM between the first heat spreader and a bottom surface of the plate element is a first TIM;
   a second TIM is between the first heat spreader and the first IC die;
   the TIM between the second heat spreader and bottom surface in the second region of the heat sink is a third TIM;
   a fourth TIM is between the second heat spreader and the second IC die; and
   a first sum of a height of the first TIM and a height of the second TIM is less than a second sum of a height of the third TIM and a height of the fourth TIM.

8. The apparatus of claim 6,
   wherein the heat sink has an indentation in the first region; and
   wherein at least a portion of the plate element is located within the indentation.

9. The apparatus of claim 6, wherein the one or more thermal conduit elements apply at least a part of the compressive load between the plate element and the heat sink.

10. The apparatus of claim 6,
    wherein the one or more protruding elements apply at least a part of the compressive load between the plate element and the heat sink.

11. The apparatus of claim 6, wherein the one or more spring elements comprise a coil spring or a leaf spring.

12. The apparatus of claim 6, wherein the one or more thermal conduit elements comprise one or more heat pipes.

13. A system including:
    a memory;
    a processor communicatively coupled to the memory, wherein the memory comprises the first IC die of claim 6, and the processor comprises the second IC die of claim 1.

14. The system of claim 13, comprising one or more thermal conduit elements secured to both the heat sink and the plate, wherein the one or more thermal conduit elements apply at least a part of the compressive load on the one or more springs.

15. The system of claim 13, wherein the one or more protruding elements apply at least a part of the compressive load between the plate element and the heat sink.

16. The system of claim 13, further comprising a power supply coupled to the processor.

* * * * *